(12) United States Patent
Lin et al.

(10) Patent No.: US 10,935,050 B2
(45) Date of Patent: Mar. 2, 2021

(54) MOUNT BRACKET

(71) Applicant: Cooler Master Co., Ltd., New Taipei (TW)

(72) Inventors: Fu-Lung Lin, New Taipei (TW); Chien-Heng Lai, New Taipei (TW); Shi-Man Xu, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 201 days.

(21) Appl. No.: 16/118,712

(22) Filed: Aug. 31, 2018

(65) Prior Publication Data

US 2019/0072113 A1    Mar. 7, 2019

(30) Foreign Application Priority Data

Sep. 1, 2017    (CN) .......................... 201721116197.0

(51) Int. Cl.
| | |
|---|---|
| *F16M 13/00* | (2006.01) |
| *F04D 29/66* | (2006.01) |
| *G06F 1/20* | (2006.01) |
| *F04D 25/06* | (2006.01) |
| *F04D 29/60* | (2006.01) |
| *F16M 13/02* | (2006.01) |
| *F16F 15/08* | (2006.01) |
| *F16F 15/06* | (2006.01) |

(Continued)

(52) U.S. Cl.
CPC ....... *F04D 29/668* (2013.01); *F04D 25/0613* (2013.01); *F04D 29/601* (2013.01); *F16M 13/02* (2013.01); *G06F 1/20* (2013.01); *F16F 1/18* (2013.01); *F16F 1/373* (2013.01); *F16F 1/3732* (2013.01); *F16F 15/06* (2013.01); *F16F 15/08* (2013.01); *F16F 2224/02* (2013.01); *F16F 2224/025* (2013.01); *F16F 2224/0208* (2013.01); *H05K 7/14* (2013.01)

(58) Field of Classification Search
CPC .. F04D 29/5853; F04D 29/663; F04D 29/668; F04D 25/0613; F04D 29/601; F16M 13/02; F16F 1/18; F16F 1/373
USPC ................. 248/604; 415/119, 213.1; 269/55; 267/136, 140.11; 361/679.48, 695, 825; 417/423.7
See application file for complete search history.

(56) References Cited

U.S. PATENT DOCUMENTS

| | | | |
|---|---|---|---|
| 9,887,609 B2* | 2/2018 | Lin | .................... F04D 25/0653 |
| 10,738,796 B2* | 8/2020 | Horng | ................... F04D 19/002 |

(Continued)

*Primary Examiner* — Todd M Epps
(74) *Attorney, Agent, or Firm* — Locke Lord LLP; Tim Tingkang Xia, Esq.

(57) ABSTRACT

The disclosure provides a mount bracket which is configured for a fan. The mount bracket includes a button plate, a frame and a plurality of vibration-absorbing components. The button plate is mounted with a motor mount. The frame surrounds the button plate, and the frame has an inner lateral surface and an outer lateral surface. A plurality of fixing structures protrude from the outer lateral surface of the frame. The inner lateral surface of the frame and an outer lateral surface of the button plate form an annular gap therebetween. The vibration-absorbing components are spaced apart from each other and located in the annular gap, and the vibration-absorbing components are located between and connected to the outer lateral surface of the button plate and the inner lateral surface of the frame.

27 Claims, 6 Drawing Sheets

(51) Int. Cl.
*F16F 1/18* (2006.01)
*F16F 1/373* (2006.01)
*H05K 7/14* (2006.01)

(56) References Cited

U.S. PATENT DOCUMENTS

| | | | |
|---|---|---|---|
| 2010/0232933 A1* | 9/2010 | Chen | F04D 29/668 |
| | | | 415/119 |
| 2012/0257965 A1* | 10/2012 | Xia | F04D 29/668 |
| | | | 415/213.1 |
| 2016/0102669 A1* | 4/2016 | Lin | F04D 29/4226 |
| | | | 417/423.7 |
| 2018/0142708 A1* | 5/2018 | Horng | F04D 29/522 |

\* cited by examiner

MOUNT BRACKET

CROSS-REFERENCE TO RELATED APPLICATIONS

This non-provisional application claims priority under 35 U.S.C. § 119(a) on Patent Application No(s). 201721116197.0 filed in China on Sep. 1, 2017, the entire contents of which are hereby incorporated by reference.

TECHNICAL FIELD

The disclosure provides a mount bracket, more particularly to a mount bracket for a fan.

BACKGROUND

As electronic products become more and more compact and complex, the requirement of heat dissipation largely increases, thus heat dissipation now is a key issue to consider in designing the electronic products. Normally, fan is the most common cooling device used in the electronic products.

In order to easily install the fan, the bottom of the fan is usually mounted with a supporting piece which is made of a single piece. However, during the operation of the fan, the vibration caused by the fan motor will be transmitted to other electronic components in the electronic product via the mount bracket, causing unfavorable effects to these electronic components.

SUMMARY OF THE INVENTION

The disclosure provides a mount bracket which is capable of solving the unfavorable effects on the electronic components in the electronic product in the prior art caused by the vibration caused by the fan motor.

One embodiment of the disclosure provides a mount bracket which is configured for a fan. The mount bracket includes a button plate, a frame and a plurality of vibration-absorbing components. The button plate is mounted with a motor mount. The frame surrounds the button plate, and the frame has an inner lateral surface and an outer lateral surface. A plurality of fixing structures protrude from the outer lateral surface of the frame. The inner lateral surface of the frame and an outer lateral surface of the button plate form an annular gap therebetween. The vibration-absorbing components are spaced apart from each other and located in the annular gap, and the vibration-absorbing components are located between and connected to the outer lateral surface of the button plate and the inner lateral surface of the frame.

Another embodiment of the disclosure provides a mount bracket which is configured for a fan. The mount bracket includes a button plate, a frame and at least one vibration-absorbing component. The button plate is mounted with a motor mount. The frame surrounds the button plate. The vibration-absorbing component is disposed between the button plate and the frame.

Still another embodiment of the disclosure provides a mount bracket which is configured to a fan. The mount bracket includes a button plate, a frame and vibration-absorbing sleeve. The button plate is mounted with a motor mount. The frame surrounds the button plate. The vibration-absorbing sleeve covers the frame, and the frame is connected to the button plate via the vibration-absorbing sleeve.

According to the mount bracket as discussed above, with the help of the vibration-absorbing component disposed between the button plate and the frame or the vibration-absorbing sleeve covering the frame, the mount bracket not only can support the fan, but also can decrease the unfavorable effects caused by the vibration caused by a fan motor.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
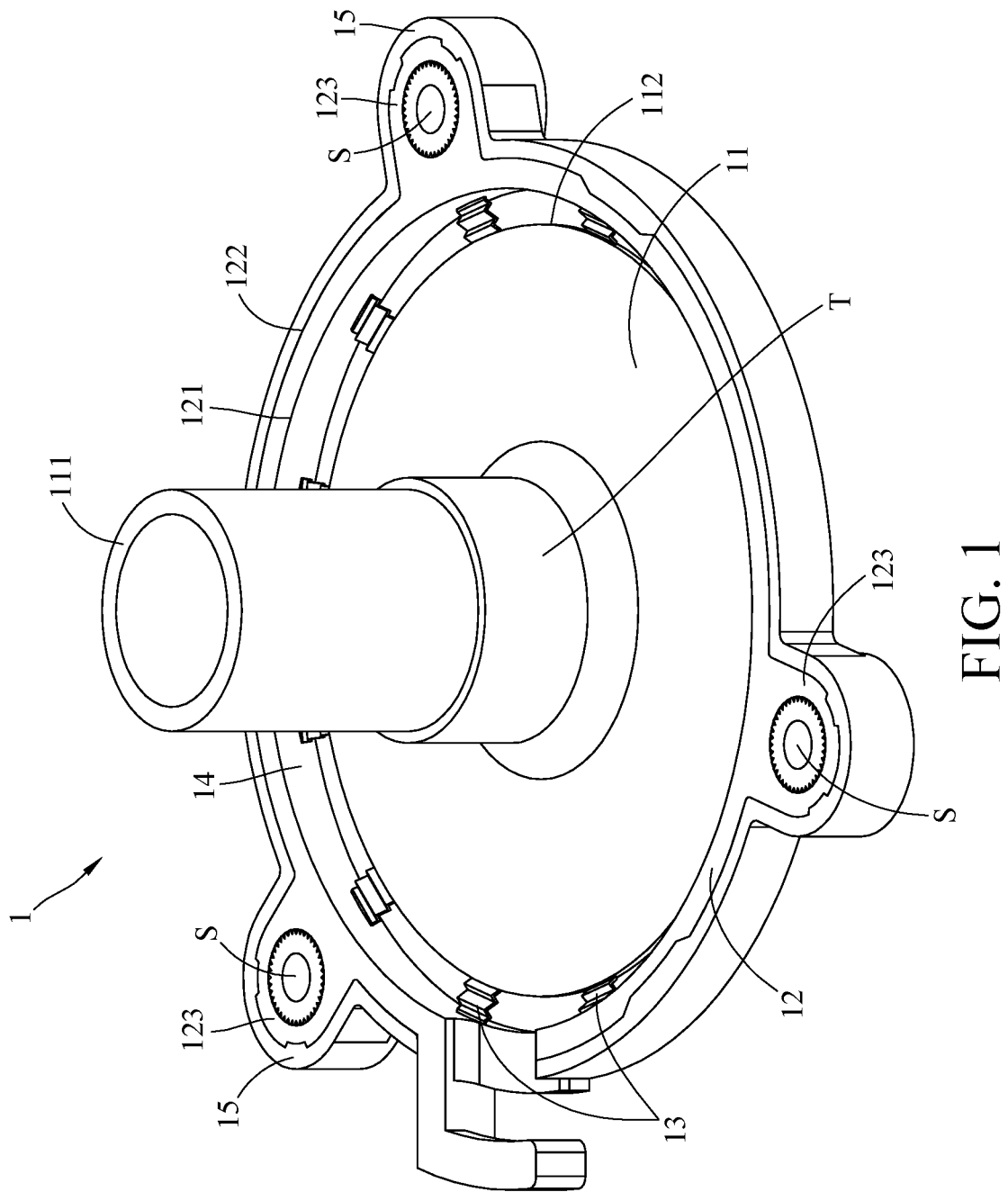
FIG. 1 is a perspective view of a mount bracket according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
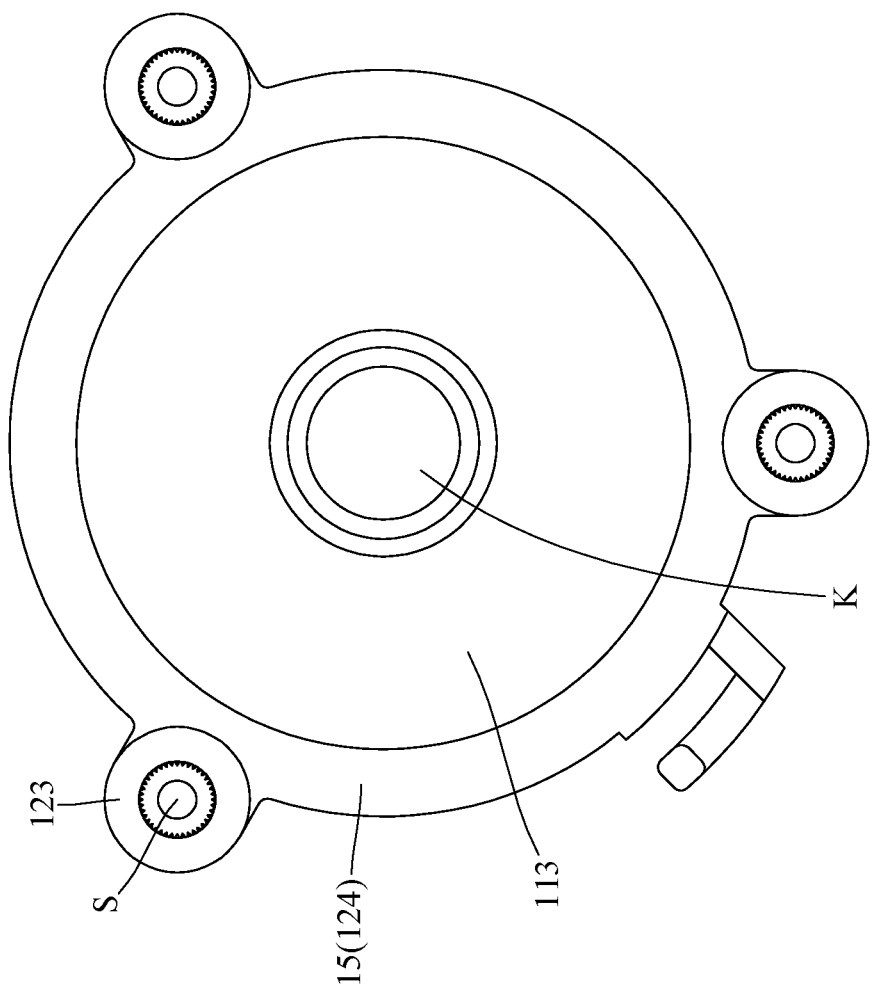
FIG. 2 is a schematic view of a button surface of the mount bracket in FIG. 1.

Please refer to FIG. 1 and FIG. 2. FIG. 1 is a perspective view of a mount bracket according to a first embodiment of the disclosure. FIG. 2 is a schematic view of a button surface of the mount bracket in FIG. 1.

This embodiment provides a mount bracket 1 which is configured to be fixed with a fan. The mount bracket 1 includes a button plate 11, a frame 12 and a plurality of vibration-absorbing components 13. A motor mount 111 is mounted on the button plate 11. The frame 12 surrounds an outer side of the button plate 11, and the frame 12 has an inner lateral surface 121 and an outer lateral surface 122. A plurality of fixing structures 123 protrude from the outer lateral surface 122 of the frame 12. There is an annular gap 14 formed between the inner lateral surface 121 of the frame 12 and an outer lateral surface 112 of the button plate 11. The vibration-absorbing components 13 are spaced apart from one another and located in the annular gap 14. In more detail, each vibration-absorbing component 13 is located between and connected to the outer lateral surface 112 of the button plate 11 and the inner lateral surface 121 of the frame 12. In this embodiment, the vibration-absorbing components 13 are made of metal, but the present disclosure is not limited thereto. In some other embodiments, the material of the vibration-absorbing components may be plastic.

Furthermore, the mount bracket 1 further includes a vibration-absorbing sleeve 15. The vibration-absorbing sleeve 15 covers the outer surface 122 of the frame 12 and lateral surfaces of the fixing structures 123. In this embodiment, the vibration-absorbing sleeve 15 further extends from the outer surface 122 of the frame 12 and the lateral surfaces of the fixing structures 123 to a button surface 124 of the frame 12 and at least part of a button surface of the button plate 11, but the present disclosure is not limited thereto.

When the fan is activated, the vibration caused by a fan motor is transmitted to the vibration-absorbing components 13 and at least part of the vibration is absorbed by the vibration-absorbing components 13. The remained vibration that is not absorbed by the vibration-absorbing components 13 will be transmitted to the vibration-absorbing sleeve 15 and then be absorbed by the vibration-absorbing sleeve 15. As a result, the vibration is prevented from being transmitted to other electronic components in an electronic product.

It is noted that the vibration-absorbing sleeve 15 is preferably made of rubber, but the material of the vibration-absorbing sleeve 15 is not restricted in the present disclosure.

Moreover, each fixing structure 123 has a through hole S, and fasteners (not shown in figures) can be respectively disposed through the through holes S and be fixed to the fan (not shown in figures) so as to fix the mount bracket 1 and the fan to each other.

Furthermore, there is a protrusion T disposed on the button plate 11, and the protrusion T has a through hole K connected to the top surface of the protrusion T and the button surface 113 of the button plate 11. Part of the motor mount 111 is disposed in the through hole K. In this embodiment, the protrusion T is preferably to be disposed at the center of the button plate 11, but the present disclosure is not limited thereto.

In another embodiment of the disclosure, each of the vibration-absorbing components 13 may be a spring which is located between and connected to the outer lateral surface 112 of the button plate 11 and the inner lateral surface 121 of the frame 12

In still another embodiment of the disclosure, the fixing structure 123 and the frame 12 may be made of one piece, but the present disclosure is not limited thereto.

In yet another embodiment of the disclosure, the button plate 11 and the protrusion T may be made of one piece, but the present disclosure is not limited thereto.

Figure 3:
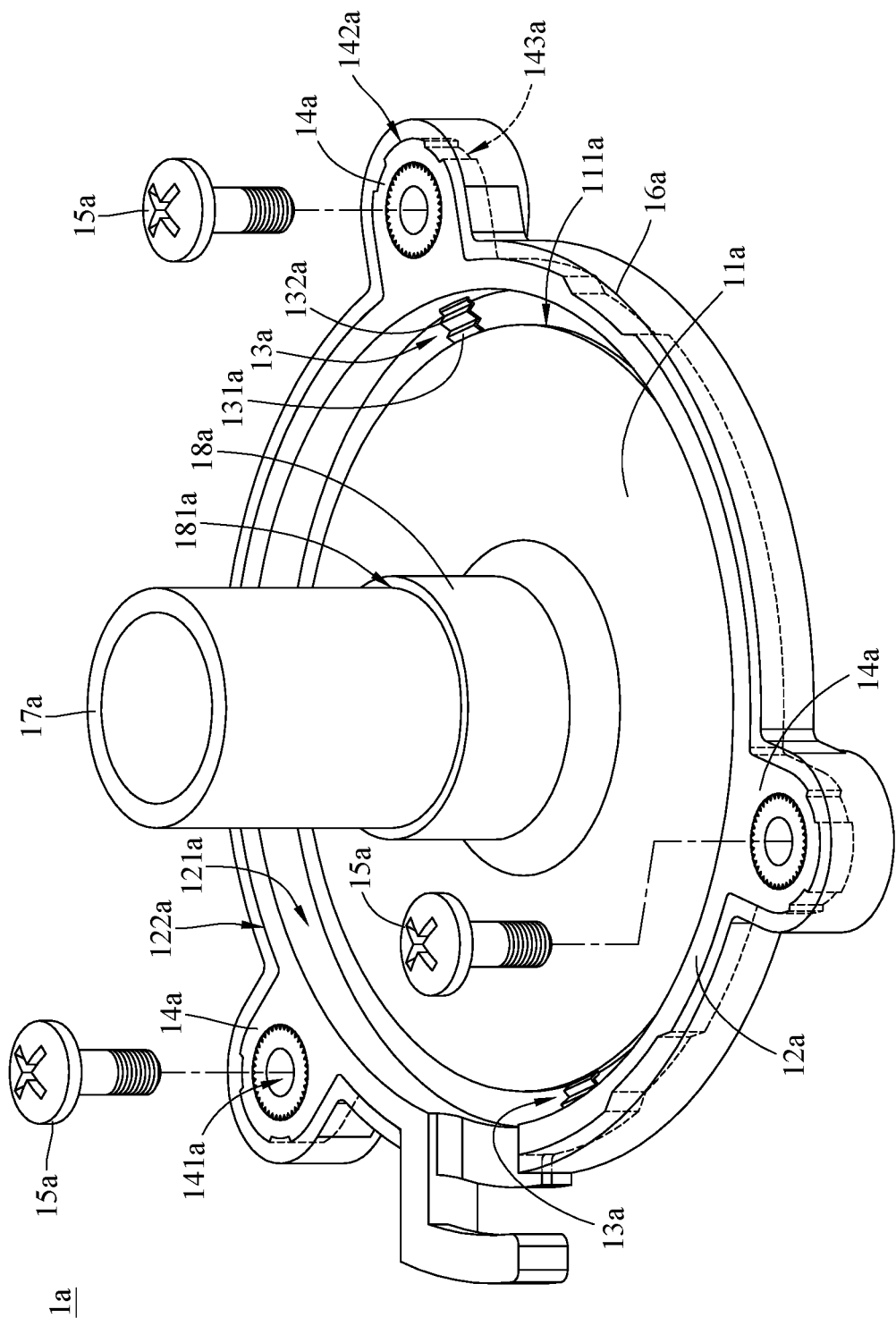
FIG. 3 is a partial exploded view of a mount bracket according to a second embodiment of the disclosure.
Figure 4:
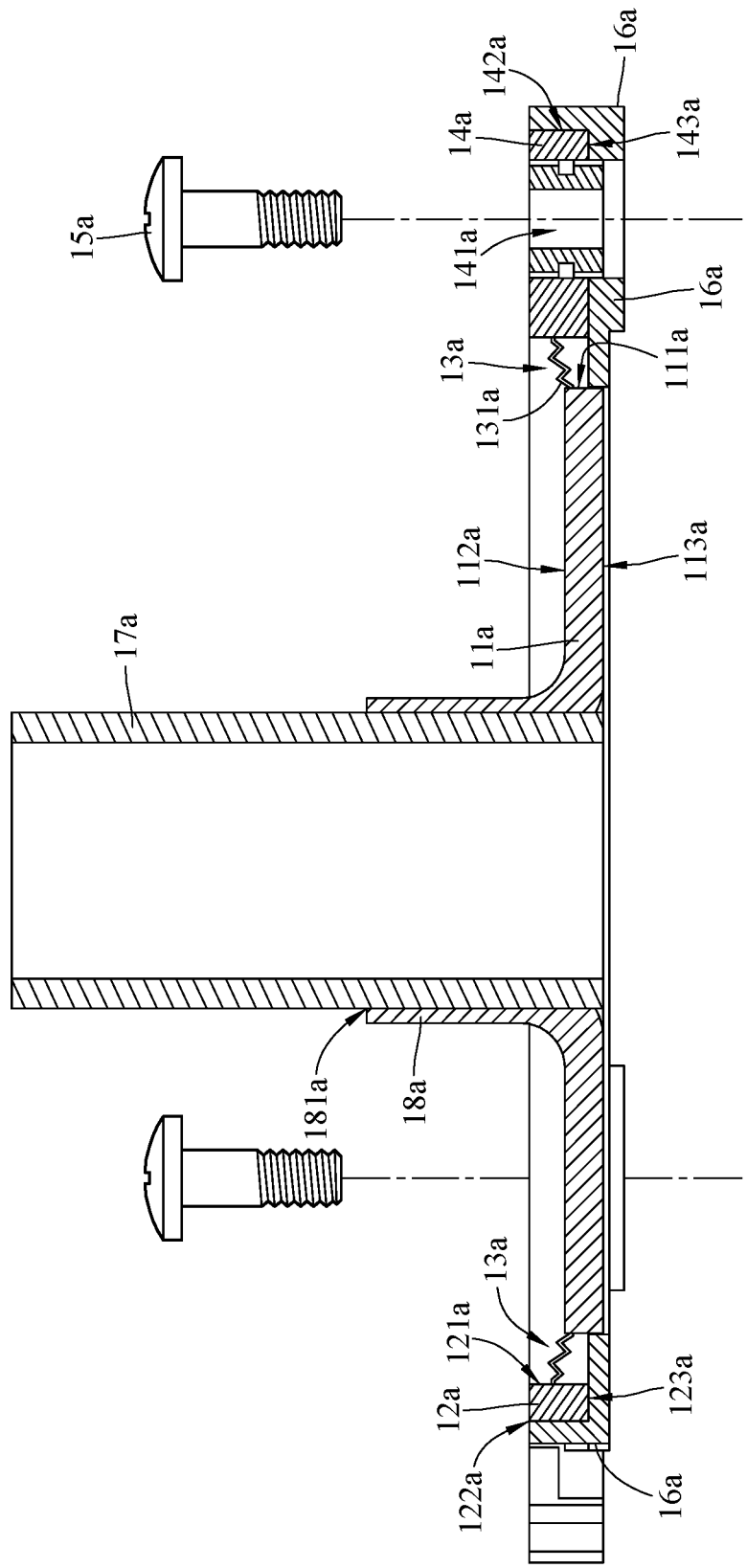
FIG. 4 is a cross-sectional view of the mount bracket in FIG. 3.

In the aforementioned embodiments, the quantity of the vibration-absorbing components 13 is larger than two, but the present disclosure is not limited thereto. Please refer to FIG. 3 and FIG. 4. FIG. 3 is a partial exploded view of a mount bracket according to a second embodiment of the disclosure. FIG. 4 is a cross-sectional view of the mount bracket in FIG. 3;

This embodiment provides a mount bracket 1a. The mount bracket 1a includes a button plate 11a, a frame 12a, two vibration-absorbing components 13a, a plurality of fixing structures 14a, a plurality of fasteners 15a and a vibration-absorbing sleeve 16a.

The button plate 11a has an outer lateral surface 111a, and the frame 12a has an inner lateral surface 121a and an outer lateral surface 122a opposite to each other. The inner lateral surface 121a of the frame 12a faces the outer lateral surface 111a of the button plate 11a. The two vibration-absorbing components 13a are disposed between the inner lateral surface 121a of the frame 12a and the outer lateral surface 111a of the button plate 11a. In detail, the two vibration-absorbing components 13a are respectively disposed on two opposite sides of the button plate 11a. In this embodiment, each vibration-absorbing component 13a is, for example, a folded elastic plate. In more detail, each vibration-absorbing component 13a includes multiple inclined portions 131a, and two of the adjacent inclined portions 131a are connected and form an edge 132a therebetween.

The fixing structures 14a protrude from the outer lateral surface 122a of the frame 12a, and each of the fixing structures 14a has a through hole 141a. The fasteners 15a are able to be respectively disposed through the through holes 141a and be fixed to a fan (not shown in figures) so as to fix the frame 12a and the fan to each other. It is noted that the quantity of the fixing structures 14a is not restricted. In some other embodiments, the mount bracket may only include one fixing structure.

Each of the fixing structures 14a has a lateral surface 142a and a button surface 143a connected to each other, and the frames 12a has a button surface 123a which is connected to the outer lateral surface 122a. The lateral surfaces 142a of the fixing structures 14a are connected to the outer lateral surface 122a of the frame 12a, and the button surfaces 143a of the fixing structures 14a are connected to the button surface 123a of the frame 12a. In addition, the button plate 11a has an upper surface 112a and a button surface 113a opposite to each other. The outer lateral surface 111a of the button plate 11a is located between the upper surface 112a and the button surface 113a, and the button surface 113a of the button plate 11a is located close to the button surface 143a of the fixing structures 14a and the button surface 123a of the frame 12a.

The vibration-absorbing sleeve 16a extends from the lateral surface 142a of each of the fixing structures 14a and the outer lateral surface 122a of the frame 12a to the outer lateral surface 111a of the button plates 11a. In detail, the vibration-absorbing sleeve 16a covers the lateral surface 142a and the button surface 143a of each of the fixing structures 14a and the outer lateral surface 122a and the button surface 123a of the frame 12a, and further extends from the button surface 123a of the frame 12a to outer lateral surface 111a of the button plates 11a.

In this embodiment, a motor mount 17a is mounted on the button plate 11a of the mount bracket 1a. In detail, the mount bracket 1a further includes a protrusion 18a protruding from the upper surface 112a of the button plate 11a. The protrusion 18a has a through hole 181a penetrating the upper surface 112a and the button surface 113a of the button plate 11a; that is, the through hole 181a penetrates the button plate 11a and the protrusion 18a. And part of the motor mount 17a is mounted in the through hole 181a.

In this embodiment, the vibration-absorbing sleeve 16a only extends to the outer lateral surface 111a of the button plate 11a, but the present disclosure is not limited thereto. In some other embodiments, the vibration-absorbing sleeve may further extend to and cover a part of the button surface of the button plate or cover the entire button surface of the button of the button plate.

Figure 5:
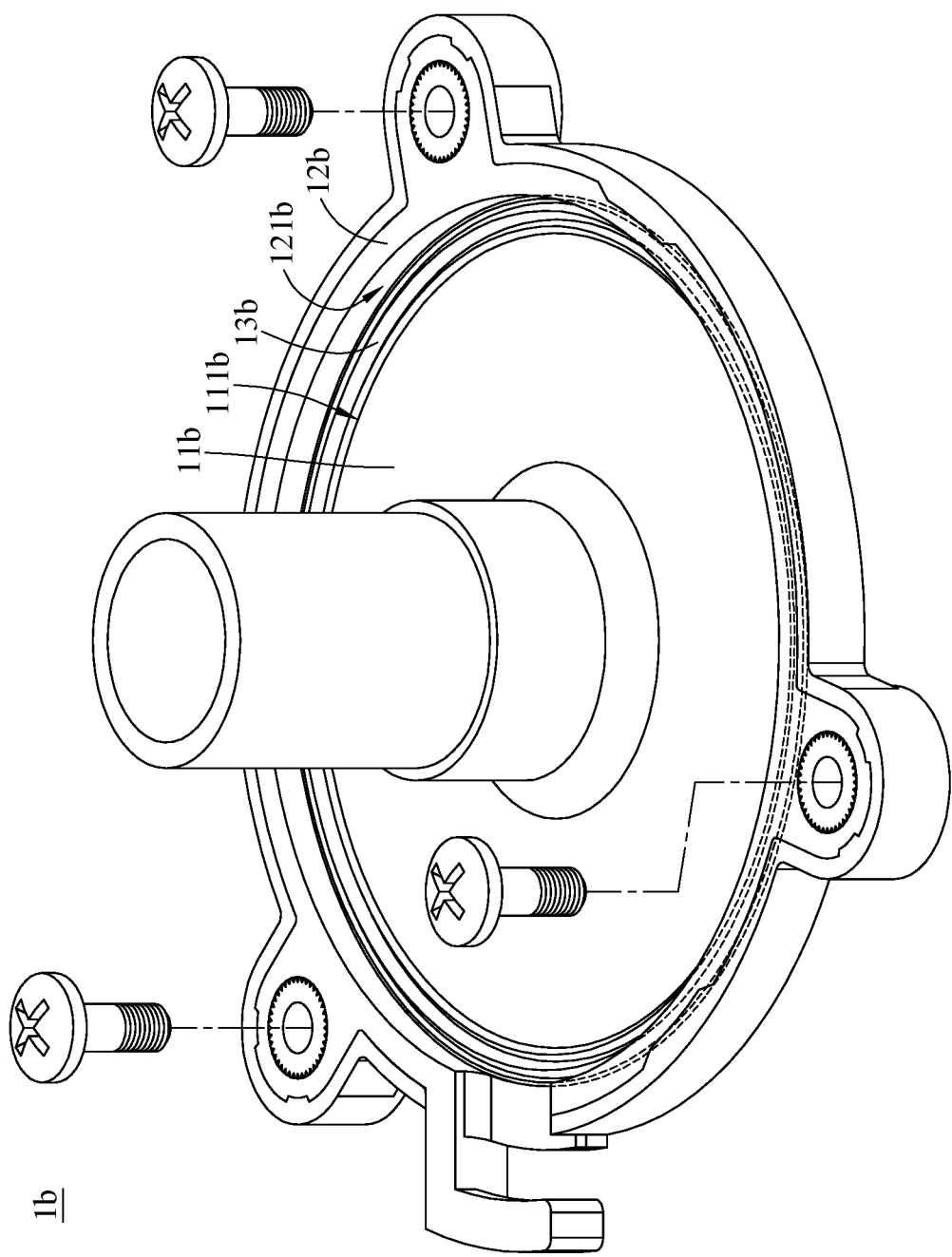
FIG. 5 is a partial exploded view of a mount bracket according to a third embodiment of the disclosure.
Figure 6:
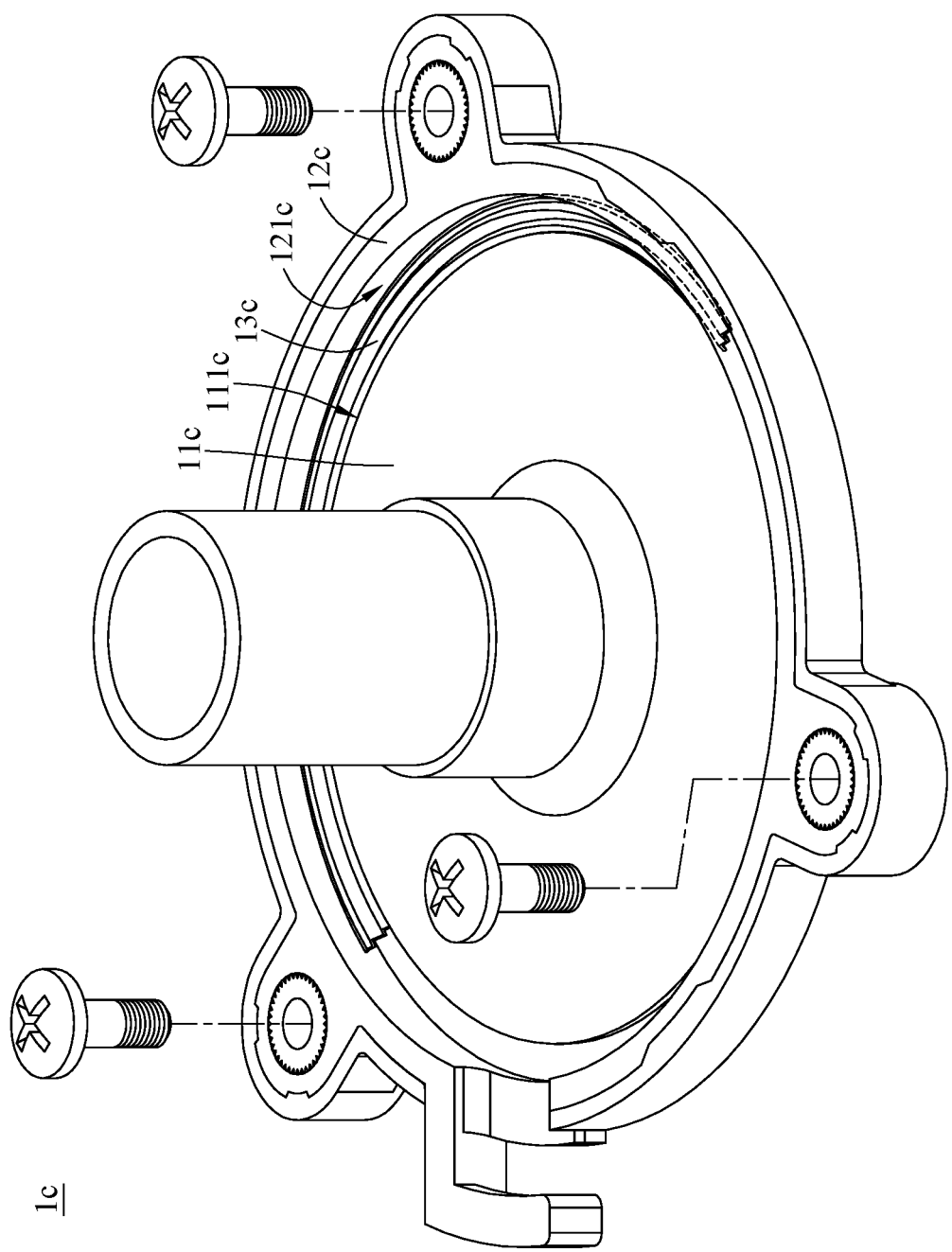
FIG. 6 is a partial exploded view of a mount bracket according to a fourth embodiment of the disclosure.

Then, please refer to FIG. 5 and FIG. 6. FIG. 5 is a partial exploded view of a mount bracket according to a third embodiment of the disclosure. FIG. 6 is a partial exploded view of a mount bracket according to a fourth embodiment of the disclosure.

As shown in FIG. 5, a mount bracket 1b only includes one vibration-absorbing component 13b, and the vibration-absorbing component 13b is in a ring shape and disposed between an inner lateral surface 121b of a frame 12b and an outer lateral surface 111b of a button plate 11b.

As shown in FIG. 6, a mount bracket 1c only includes one vibration-absorbing component 13c, and the vibration-absorbing component 13c is in a half ring shape and disposed between an inner lateral surface 121c of a frame 12c and an outer lateral surface 111c of a button plate 11c.

In addition, in the aforementioned embodiments, the mount brackets all include the vibration-absorbing components and the vibration-absorbing sleeve at the same time, but the present disclosure is not limited thereto. In some other embodiments, the mount bracket may only have the vibration-absorbing sleeve.

According to the mount bracket as discussed above, the mount bracket not only can support the fan, but also can decrease unfavorable effects caused by the vibration caused by the fan motor.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A mount bracket, configured for a fan, comprising:
   a button plate being mounted with a motor mount;
   a frame surrounding the button plate, the frame having an inner lateral surface and an outer lateral surface, a plurality of fixing structures on the outer lateral surface of the frame, the mount bracket having an annular gap between the inner lateral surface of the frame and an outer lateral surface of the button plate;
   a plurality of vibration-absorbing components being spaced apart from each other and located in the annular gap, and the plurality of vibration-absorbing components being located between and connected to the outer lateral surface of the button plate and the inner lateral surface of the frame; and
   a vibration-absorbing sleeve which covers the outer lateral surface of the frame and lateral surfaces of the plurality of fixing structures.

2. The mount bracket according to claim 1, wherein the vibration-absorbing sleeve further extends from the outer lateral surface of the button plate and the lateral surfaces of the plurality of fixing structures to cover a button surface of the frame and at least part of a button surface of the button plate.

3. The mount bracket according to claim 1, further comprising a plurality of fasteners, wherein each of the plurality of fixing structures has a through hole, and the plurality of fasteners are respectively disposed through the through holes and be fixed to the fan.

4. The mount bracket according to claim 1, wherein a protrusion is disposed on the button plate, the protrusion has a through hole connected to an upper surface of the protrusion and a button surface of the button plate, and part of the motor mount is mounted in the through hole.

5. The mount bracket according to claim 4, wherein the button plate and the protrusion are made of one piece.

6. The mount bracket according to claim 1, wherein each of the plurality of vibration-absorbing components is made of metal or plastic.

7. The mount bracket according to claim 1, wherein each of the plurality of vibration-absorbing components is a spring.

8. The mount bracket according to claim 1, wherein the plurality of fixing structures and the frame are made of one piece.

9. The mount bracket according to claim 1, wherein the vibration-absorbing sleeve is made of rubber.

10. A mount bracket, configured for a fan, comprising:
    a button plate being mounted with a motor mount;
    a frame surrounding the button plate;
    at least one vibration-absorbing component disposed between the button plate and the frame;
    at least one fixing structure, and the frame having an outer lateral surface, wherein the at least one fixing structure protrudes from the outer lateral surface of the frame, and the at least one fixing structure is configured to allow the frame and the fan to be fixed with each other; and
    a vibration-absorbing sleeve, wherein the vibration-absorbing sleeve covers the outer lateral surface of the frame.

11. The mount bracket according to claim 10, wherein the frame has an inner lateral surface, the button plate has an outer lateral surface, the inner lateral surface of the frame faces the outer lateral surface of the button plate, and the at least one vibration-absorbing component is disposed between the inner lateral surface of the frame and the outer lateral surface of the button plate.

12. The mount bracket according to claim 10, wherein the quantity of the at least one vibration-absorbing component is one, and the vibration-absorbing component is in a ring shape.

13. The mount bracket according to claim 10, wherein the quantity of the at least one vibration-absorbing component is one, and the vibration-absorbing component is in a half ring shape.

14. The mount bracket according to claim 10, wherein the quantity of the at least one vibration-absorbing component is two, and the two vibration-absorbing components are respectively disposed on two opposite sides of the button plate.

15. The mount bracket according to claim 10, wherein the at least one fixing structure and the frame are made of one piece.

16. The mount bracket according to claim 10, further comprising at least one fastener, and the at least one fixing structure having a through hole, wherein the at least one fastener is disposed through the through hole and be fixed to the fan.

17. The mount bracket according to claim 10, wherein the vibration-absorbing sleeve is made of rubber.

18. The mount bracket according to claim 10, wherein the at least one vibration-absorbing component is a spring or an elastic plate.

19. The mount bracket according to claim 10, wherein the at least one vibration-absorbing component is made of metal or plastic.

20. The mount bracket according to claim 10, wherein the at least one vibration-absorbing component comprises a plurality of inclined portions, two of the plurality of the at least one vibration-absorbing component which are adjacent to each other are connected and form an edge therebetween.

21. The mount bracket according to claim 10, further comprising a protrusion, and the button plate having an upper surface and a button surface opposite to each other, wherein the protrusion protrudes from the upper surface of the button plate, the protrusion has a through hole, the through hole penetrates the upper surface and the button surface of the button plate, and the motor mount is mounted in the through hole.

22. The mount bracket according to claim 21, wherein the protrusion and the button plate are made of one piece.

23. The mount bracket according to claim 10, wherein the button plate has an outer lateral surface, and the vibration-absorbing sleeve extends from the outer lateral surface of the frame to the outer lateral surface of the button plate.

24. The mount bracket according to claim 23, wherein the button plate has an upper surface and a button surface opposite to each other, the outer lateral surface of the button plate is located between the upper surface and the button surface of the button plate, the motor mount is disposed on the upper surface of the button plate, and the vibration-absorbing sleeve further extends to part of the button surface of the button plate.

25. The mount bracket according to claim 24, wherein the vibration-absorbing sleeve further extends to the entire button surface of the button plate.

26. The mount bracket according to claim 23, wherein the at least one fixing structure has a lateral surface, the lateral surface of the at least one fixing structure is connected to the outer lateral surface of the frame, and the vibration-absorbing sleeve covers the lateral surface of the at least one fixing structure.

27. The mount bracket according to claim 26, wherein the at least one fixing structure further has a button surface, the button surface of the at least one fixing structure is connected to the lateral surface of the at least one fixing structure, the button surface of the at least one fixing structure is located close to the button surface of the button plate, and the vibration-absorbing sleeve covers the button surface of the at least one fixing structure.

* * * * *